(12) United States Patent
Thibault

(10) Patent No.: US 10,697,818 B2
(45) Date of Patent: Jun. 30, 2020

(54) CAPACITIVE DETECTION DEVICE AND MEASURING DEVICE INCLUDING SAME

(71) Applicant: Universite Grenoble Alpes, Saint-Martin-d'Heres (FR)

(72) Inventor: Pierre Jean-Yves Thibault, Saint-Martin-d'Uriage (FR)

(73) Assignee: Université Grenoble Alpes, Saint-Martin-d'Hères (FR)

( * ) Notice: Subject to any disclaimer, the term of this patent is extended or adjusted under 35 U.S.C. 154(b) by 162 days.

(21) Appl. No.: 15/597,017

(22) Filed: May 16, 2017

(65) Prior Publication Data

US 2017/0336242 A1 Nov. 23, 2017

(30) Foreign Application Priority Data

May 17, 2016 (FR) ...................................... 16 54349

(51) Int. Cl.
| | | |
|---|---|---|
| *G01F 23/26* | (2006.01) | |
| *G01D 5/24* | (2006.01) | |
| *G01D 5/241* | (2006.01) | |
| *G01R 27/26* | (2006.01) | |

(52) U.S. Cl.
CPC ......... *G01F 23/268* (2013.01); *G01D 5/2405* (2013.01); *G01D 5/2412* (2013.01); *G01R 27/2605* (2013.01)

(58) Field of Classification Search
CPC ............ G01D 5/24; G01D 5/05; G01D 5/241; G01D 5/2417; G01F 23/26; G01F 23/263; G01F 23/268; G01R 27/2605
USPC ........................................... 73/304 R, 304 C
See application file for complete search history.

(56) References Cited

U.S. PATENT DOCUMENTS

| | | | |
|---|---|---|---|
| 5,207,098 A | 5/1993 | Koch et al. | |
| 2011/0107833 A1* | 5/2011 | Thibault | ............... G01F 23/268 |
| 2011/0120219 A1* | 5/2011 | Barlesi | .................. G01F 23/266 |
| 2012/0111107 A1 | 5/2012 | Shimura | |

FOREIGN PATENT DOCUMENTS

| | | |
|---|---|---|
| EP | 0508143 A2 | 10/1992 |
| WO | 2008101333 A1 | 8/2008 |
| WO | 2009122061 A2 | 10/2009 |
| WO | 2010023766 A1 | 3/2010 |

OTHER PUBLICATIONS

Search Report and Written Opinion, dated Feb. 10, 2017, in priority French Patent Application No. 1654349, dated May 17, 2016, 6 pages.

* cited by examiner

*Primary Examiner* — Benjamin R Schmitt
(74) *Attorney, Agent, or Firm* — Christensen O'Connor Johnson Kindness PLLC

(57) ABSTRACT

A capacitive detection device comprising: a capacitive detector comprising a ribbon made of a dielectric material, a pair of electrodes formed on a first face of said ribbon and comprising a first electrode and a second electrode in the form of combs whose branches are arranged alternately between one another; and a third electrode in the form of a layer formed on the other face of said ribbon; and further comprising a containment electrode arranged at least partly facing and at a distance from said pair of electrodes, this containment electrode being electrically connected to said third electrode. Measurement devices including this capacitive detection device are also disclosed.

11 Claims, 7 Drawing Sheets

CAPACITIVE DETECTION DEVICE AND MEASURING DEVICE INCLUDING SAME

BACKGROUND

The present invention relates to the field of capacitive detection devices and their applications to measuring devices, in particular measuring displacements, fluid levels, thicknesses notably of fluid film and presence detection.

It is known practice to produce capacitive detectors which comprise, on one face of a ribbon made of a dielectric material, two electrodes in the form of combs whose branches are arranged alternately between one another, or interdigitally, and, on the other face, a ground electrode. It is known that the presence of the ground electrode makes it possible by a three-wire measurement to increase the sensitivity of the device, and to protect it from stray external effects. In general, it is considered that the capacitance between the interdigital electrodes of such a device is the sum of a dielectric contribution inside the ribbon and of another dielectric contribution on the outer part of the plane of the electrodes, which comes from vacuum or from a fluid.

Moreover, the international patent application published under the number WO2009/122061 describes a capacitive detector whose features make it possible to increase the sensitivity of such capacitive detectors.

The European patent application published under the number 0 508 143 describes a capacitive measurement device which comprises an outer electrode situated on the outside of a container and an inner electrode situated inside this container. These electrodes constitute a measurement capacitance in relation to fluids circulating in the container. The useful measured variable consists of the electrical signal deriving from this capacitance.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

According to one embodiment, a capacitive detection device is proposed which comprises a capacitive detector and a containment electrode.

The capacitive detector comprises a ribbon made of a dielectric material; at least one pair of electrodes comprising a first electrode in the form of a comb formed on a first face of said ribbon and comprising parallel transverse branches linked to one another by a longitudinal link branch and a second electrode in the form of a comb formed on said first face of said ribbon and comprising parallel transverse branches linked to one another by a longitudinal link branch, the transverse branches of said first and second electrodes being arranged alternately between one another according to at least one determined period ($\lambda$); and at least one third electrode in the form of a layer formed on the other face of said ribbon, this third electrode and said pair of electrodes covering opposite areas of said ribbon.

The containment electrode is arranged at least partly facing and at a distance from said pair of electrodes, this containment electrode being electrically connected to said third electrode.

The capacitive detector and the containment electrode can be flat and arranged parallel.

The capacitive detector and the containment electrode can extend along concentric circumferences.

The thickness (e) of the dielectric ribbon can be less than or equal to said determined period ($\lambda$) divided by four times PI (i.e.: $\lambda/4\pi \leq e$).

The ratio, resulting from the division, in numerator, of the capacitance (C) between two adjacent branches of said first and second electrodes in the presence of at least one chosen medium of dielectric permittivity ($\varepsilon_m$), interposed between the capacitive detector and the containment electrode, and in denominator by the dielectric permittivity ($\varepsilon_m$) of the medium multiplied by the capacitance (Co) between the two adjacent branches of the first and second electrodes in the presence of vacuum, is greater than or equal to one (i.e.: $C/\varepsilon_m \cdot Co \geq 1$).

The distance between the containment electrode and the capacitive detector can lie between a twentieth of and twenty times said determined period ($\lambda$).

The device can comprise an electronic measurement circuit to which said first and second electrodes are linked, the third electrode and the containment electrode being set at a same reference potential, the electronic measurement circuit comprising a measurement device linked to the first and second electrodes and capable of delivering an electrical signal relating to the measurement of the capacitance between the first and second electrodes.

Also proposed is a device for measuring the level of a fluid or the thickness of a film of fluid, which comprises a detection device as defined above, in which at least a part of the liquid is present between the capacitive detector and the containment electrode; and a means for measuring the capacitance between said first and second electrodes of the pair of electrodes of the capacitive detector.

Also proposed is a device for measuring displacement of a first part relative to a second part which comprises a detection device as defined above, in which the capacitive detector is secured to one of the parts and the containment electrode is secured to the other part; and a means for measuring the capacitance between said first and second electrodes of the pair of electrodes of the capacitive detector.

Said parts can be capable of being displaced in the direction which moves the capacitive detector and the containment electrode away from and/or closer to one another.

Said parts can be capable of being displaced in the direction which increases or reduces the overlap of the containment electrode relative to the capacitive detector.

Also proposed is a device for measuring displacement of a first part relative to a second part, which comprises a detection device as defined above, in which the capacitive detector and the containment electrode are secured to one of the parts, the other part comprising a dielectric element secured to the other part and engaged between the capacitive detector and the containment electrode; and a means for measuring the capacitance between said first and second electrodes of the pair of electrodes of the capacitive detector.

DESCRIPTION OF THE DRAWINGS

A detection device and measurement devices will now be described as non-limiting examples, illustrated by the attached drawing in which.

DETAILED DESCRIPTION

Figure 1:
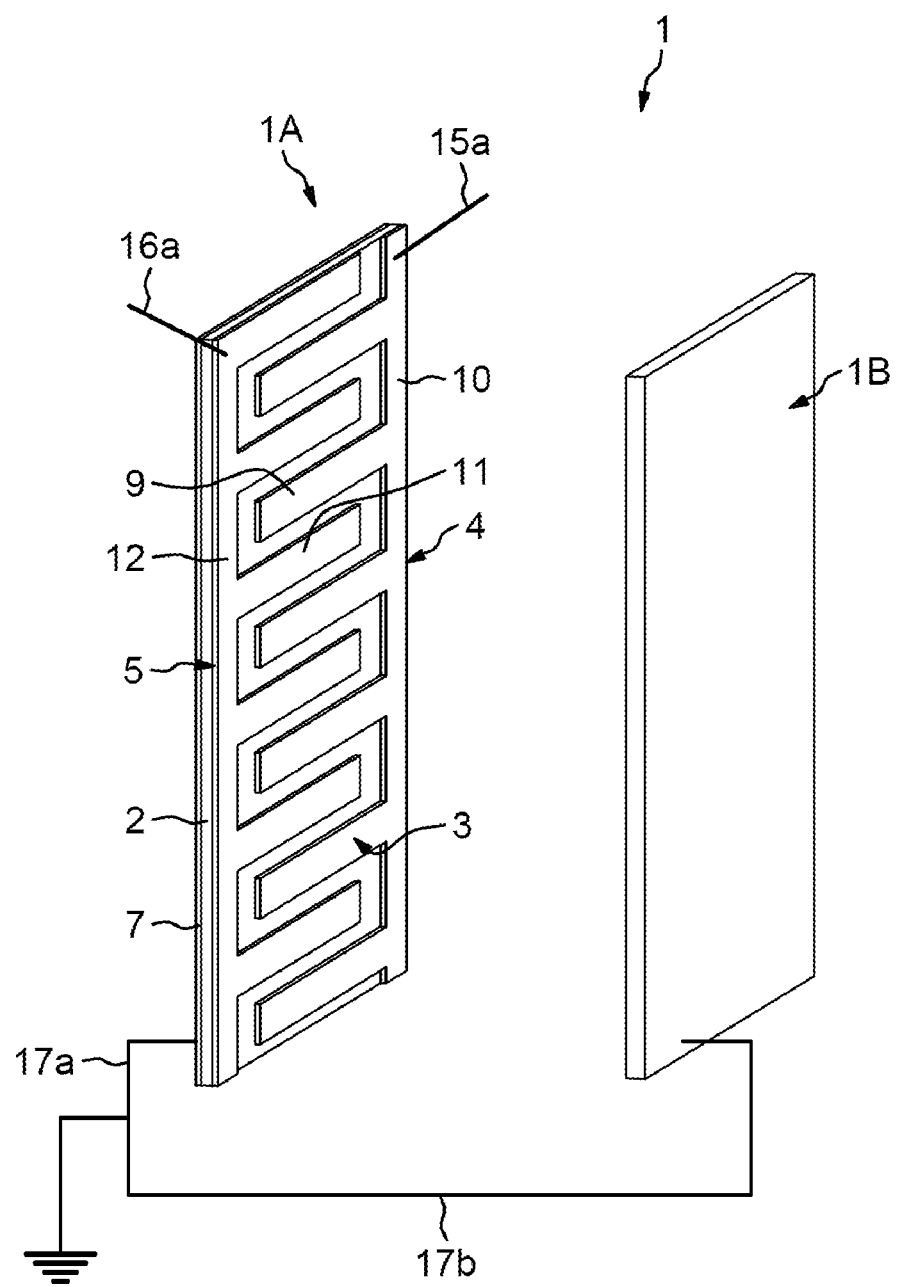
FIG. 1 illustrates, in perspective, a detection device including a capacitive detector.
Figure 2:
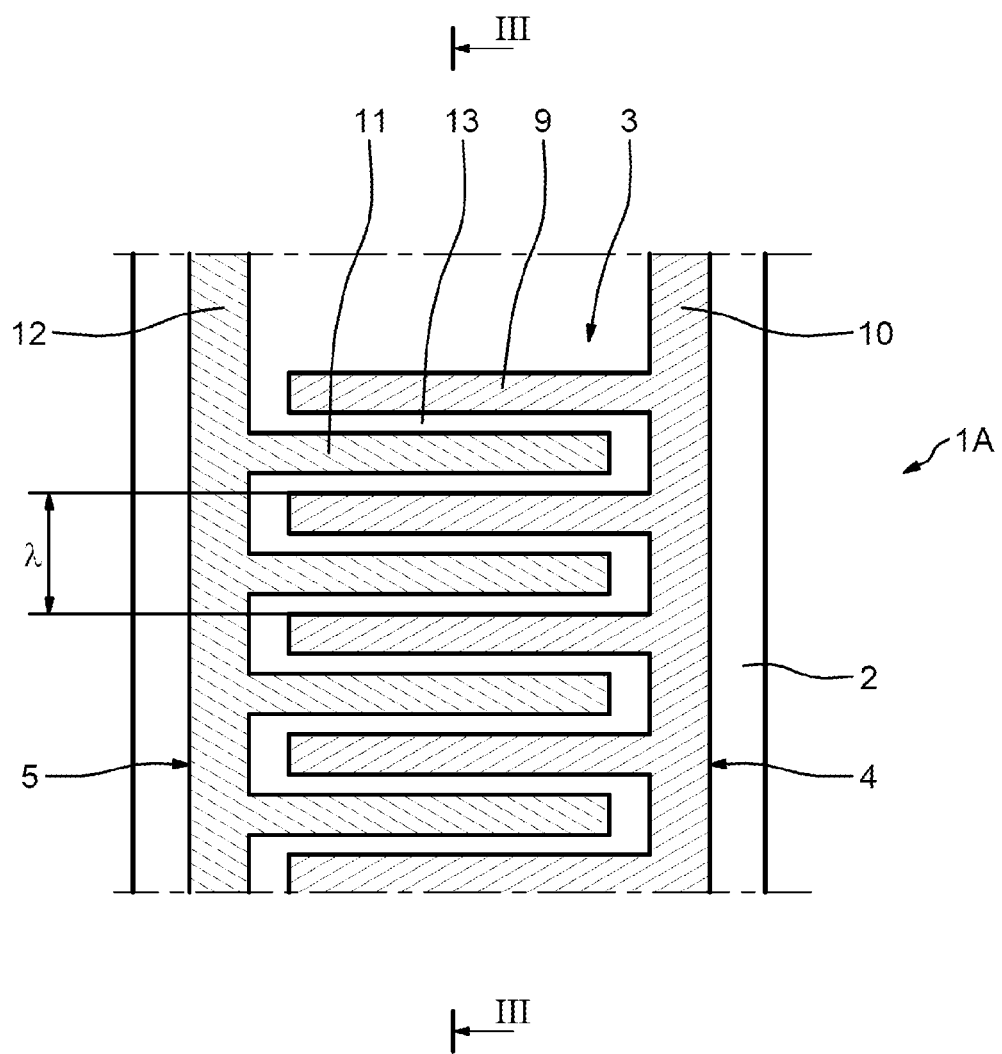
FIG. 2 illustrates a side view of the capacitive detector of FIG. 1.
Figure 3:
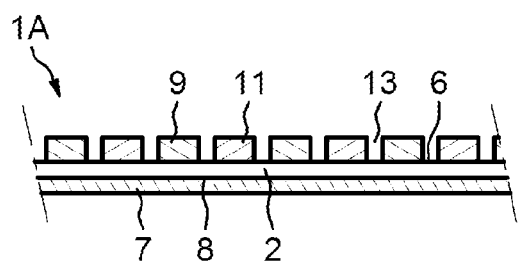
FIG. 3 illustrates a longitudinal cross section of the capacitive detector of FIG. 1.

FIGS. 1 to 3 illustrate a capacitive detection device 1 which comprises a capacitive detector 1A and a containment electrode 1B.

The capacitive detector 1A comprises a longitudinal ribbon 2 made of a dielectric material, flexible or rigid, a pair 3 of electrodes comprising a first electrode 4 and a second electrode 5 formed on a face 6 of the dielectric ribbon 2 and a third electrode 7 formed on the other face 8 of the dielectric ribbon 2.

The first electrode 4 is in the form of a comb and comprises parallel transverse branches 9, evenly spaced apart and linked to one another by a longitudinal link branch 10.

The second electrode 5 is in the form of a comb and comprises parallel transverse branches 11, evenly spaced apart and linked to one another by a longitudinal link branch 12.

The transverse branches 9 and 11 of the first and second electrodes 4 and 5 are arranged alternately between one another, have equal widths and equal lengths and are equidistantly spaced apart from one another, the transverse branches 9 extending toward the longitudinal link branch 12 and the parallel transverse branches 11 extending toward the longitudinal link branch 10. Such an arrangement is called an interdigital structure.

Thus, the transverse branches 9 and 11 are arranged according to a determined period $\lambda$ which comprises the addition of a width of the branches 9 of the electrode 4 of a width of the branches 11 of the electrode 5 and of two spaces 13 between two adjacent branches 9 and 11.

The third electrode 7 takes the form of a layer which, advantageously, covers an area of the face 8 of the dielectric ribbon 2 opposite the area of the face 6 of the dielectric ribbon 2 covered by the pair 3 of interdigital electrodes 4 and 5.

For example, the dielectric ribbon 2 can be made of a plastic material such as a polyimide like Kapton, or such as a polytetrafluoroethylene (Teflon) and the electrodes 4, 5 and 7 can be formed by layers of a metallic material such as copper or gold. The opposite faces of the capacitive detector 1A can be covered with thin protective layers covering the pair 3 of interdigital electrodes 4 and 5 and the electrode 7, these thin protective layers being for example made of a dielectric material.

The containment electrode 1B is formed by a plate made of an electrically conductive material, formed for example from a metal sheet of copper or of gold. The containment electrode 1B is situated on the side or opposite the face 6 of the ribbon 2 bearing the pair 3 of interdigital electrodes 4 and 5 and is arranged parallel to and at a distance from the capacitive detector 1A, such that there is a space of constant thickness between the capacitive detector 1A and the containment electrode 1B.

The dielectric ribbon 2 can be, for example, made of a plastic material such as a polyimide like Kapton, or such as a polytetrafluoroethylene (Teflon).

Advantageously, the thickness e of the dielectric ribbon 2 is less than or equal to said determined period $\lambda$ divided by four times PI, i.e. the formula (1): $\lambda/4\pi \geq e$.

The ratio resulting from the division in numerator of the capacitance $\underline{C}$ between two adjacent branches 9 and 11 of the first and second electrodes 4 and 5 in the presence of at least one chosen medium of dielectric permittivity $\varepsilon_m$, interposed between the capacitive detector 1A and the containment electrode 1B, and in denominator by the dielectric permittivity ($\varepsilon_m$) of the medium multiplied by the capacitance (Co) between the two adjacent branches 9 and 11 of the first and second electrodes 4 and 5 in the presence of vacuum is greater than or equal to one, i.e. the formula (2): $C/\varepsilon_m \cdot Co \geq 1$.

The distance between the containment electrode 1B and the capacitive detector 1A can advantageously lie between a twentieth of and twenty times said determined period. $\lambda$.

Figure 4:
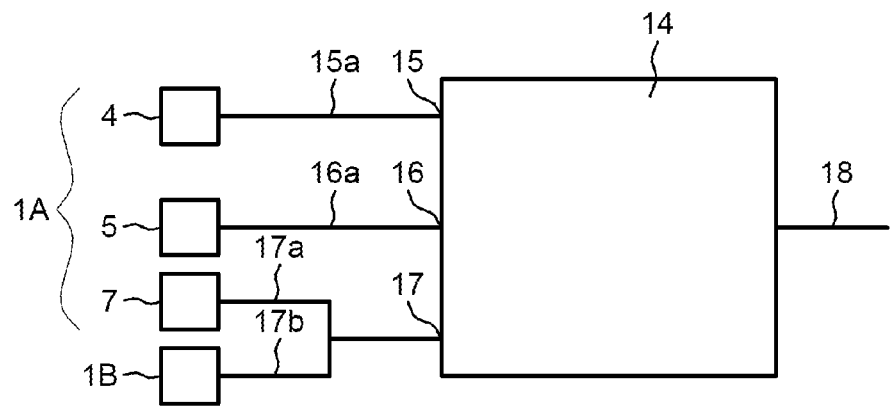
FIG. 4 illustrates an electronic circuit diagram of an electronic circuit to which the detection device of FIG. 1 is linked.

As illustrated in FIG. 4, the capacitive detection device 1 is linked to an electronic measurement circuit 14. The first and second interdigital electrodes 4 and 5 are respectively linked to inputs 15 and 16 of the electronic measurement circuit 14 by electrical wires 15a and 16a. The third electrode 7 and the containment electrode 1B are linked to a same input 17 of the electronic measurement circuit 14 by electrical wires 17a and 17b, such that the third electrode 7 and the containment electrode 1B are linked to one another.

The electronic measurement circuit 14 is adapted so that the third electrode 7 and the containment electrode 1B, via the input 17, are at a reference potential. The electronic measurement circuit 14 comprises a measurement device linked to the first and second interdigital electrodes 4 and 5, via the inputs 15 and 16, and capable of delivering on an output 18 an electrical signal relating to the measurement of the mutual capacitance between the first and second interdigital electrodes 4 and 5. It is therefore the value of this electrical signal which constitutes the useful measured variable.

For example, since the electrode 5 is referenced relative to the third electrode 7 and the containment electrode 1B that are connected to one another, the measurement device can thus be a so-called three-terminal device, and can involve a so-called Blumlein bridge measurement.

The presence of the containment electrode 1B influences the magnetic field lines in the environment of the pair 3 of interdigital electrodes 4 and 5 of the capacitive detector 1A, by inducing a distribution of the field lines between the electrodes 4 and 5 of the capacitive electrode 1A and also between the electrodes 4 and 5 and the containment electrode 1B, such that the measurement of the mutual capacitance between the interdigital electrodes 4 and 5 depends on or varies as a function of the distance between the capacitive detector 1A and the containment electrode 1B, and/or on the relative overlap between the capacitive detector 1A and the containment electrode 1B and/or on the dielectric medium established between the capacitive detector 1A and the containment electrode 1B.

The capacitive detection device 1 can be applied in many fields.

Figure 5:
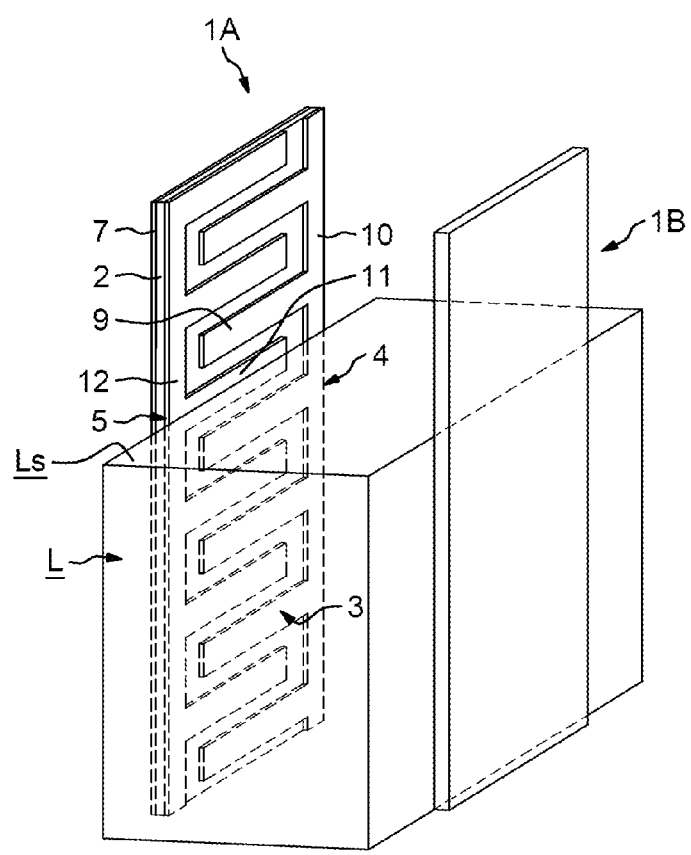
FIGS. 5 to 9 illustrate measurement devices including the abovementioned detection device of FIG. 1.

According to an application illustrated in FIG. 5, the capacitive detection device 1 can be implemented to measure the level of a liquid in a tank or in a pipe.

For that, the capacitive detector 1A and the containment electrode are placed substantially vertically, the branches 9 and 11 of the electrodes 4 and 5 being horizontal, such that a blade L of the liquid extends between them. Advantageously, the containment electrode 1B covers, at a distance, all the surface of the capacitive detector 1A.

The dielectric medium established between the capacitive detector 1A and the containment electrode 1B is defined by a part of the liquid, in the form of a blade $\underline{L}$ of liquid, which covers a bottom portion of the pair 3 of interdigital electrodes 4 and 5 of the capacitive detector 1A and of the containment electrode 1B and, above the blade L with a gas.

In the abovementioned formula (2), the dielectric permittivity $\varepsilon_m$ of the chosen medium is that of the liquid.

The number of horizontal branches 9 and 11 of the interdigital electrodes 4 and 5, covered by the blade L of liquid, depends on the level of the free surface Ls of this blade L of liquid and therefore on the level of the free surface of the liquid in the tank or the pipe.

Thus, the measured value of the mutual capacitance between the first and second interdigital electrodes 4 and 5 is a function of the length of the lower portion of the pair 3 of interdigital electrodes 4 and 5 of the capacitive detector 1A, covered by the blade L of liquid and therefore, substantially on the number of horizontal branches 9 and 11 of the interdigital electrodes 4 and 5, covered by the blade L of liquid.

This function being programmed, the electronic measurement circuit 14 is capable of delivering at its output 18 the situation and values of displacement of the level of the free surface Ls of the blade L of liquid and therefore the situation of the level of the liquid in the tank. Substantially, the variation of the measured value of the mutual capacitance between the first and second interdigital electrodes 4 and 5 is proportional to the length of the capacitive detector 1A immersed in the liquid. By calculation, the electronic measurement circuit 14 can also be capable of delivering the rate of the displacements of the free surface Ls of the blade L of liquid.

According to an exemplary placement, the containment electrode 1B can be suspended in the tank by being held taught. According to a variant, the capacitive detector 1A can be suspended in the tank or the pipe by being held taught. According to another option, the capacitive detector 1A can be attached to an internal wall of the tank or of the pipe. According to another option, the capacitive detector 1A can be attached to an outer wall of the tank or of the pipe provided that this wall is not metallic.

According to a usage variant, the measurement device 1 can also be applied to the determination of the level of any materials in powder, particulate or grain form behaving in a way equivalent to a liquid.

According to a variant application, the capacitive detection device 1 can be implemented to measure the thickness of a film of a dielectric material, for example of a film of liquid extending between the capacitive detector 1A and the containment electrode 1B.

The measured value of the mutual capacitance between the first and second interdigital electrodes 4 and 5 is a function of the thickness of the film. This function being programmed, the electronic measurement circuit 14 is capable of delivering at its output 18 the value of the thickness of the film.

According to a variant application, the capacitive detection device 1 can be implemented to detect the presence of a mist, when the measured value of the mutual capacitance between the first and second interdigital electrodes 4 and 5 crosses a predetermined threshold, and/or the density of such a mist, the measured value of the mutual capacitance between the first and second interdigital electrodes 4 and 5 being a function of this density.

Figure 6:
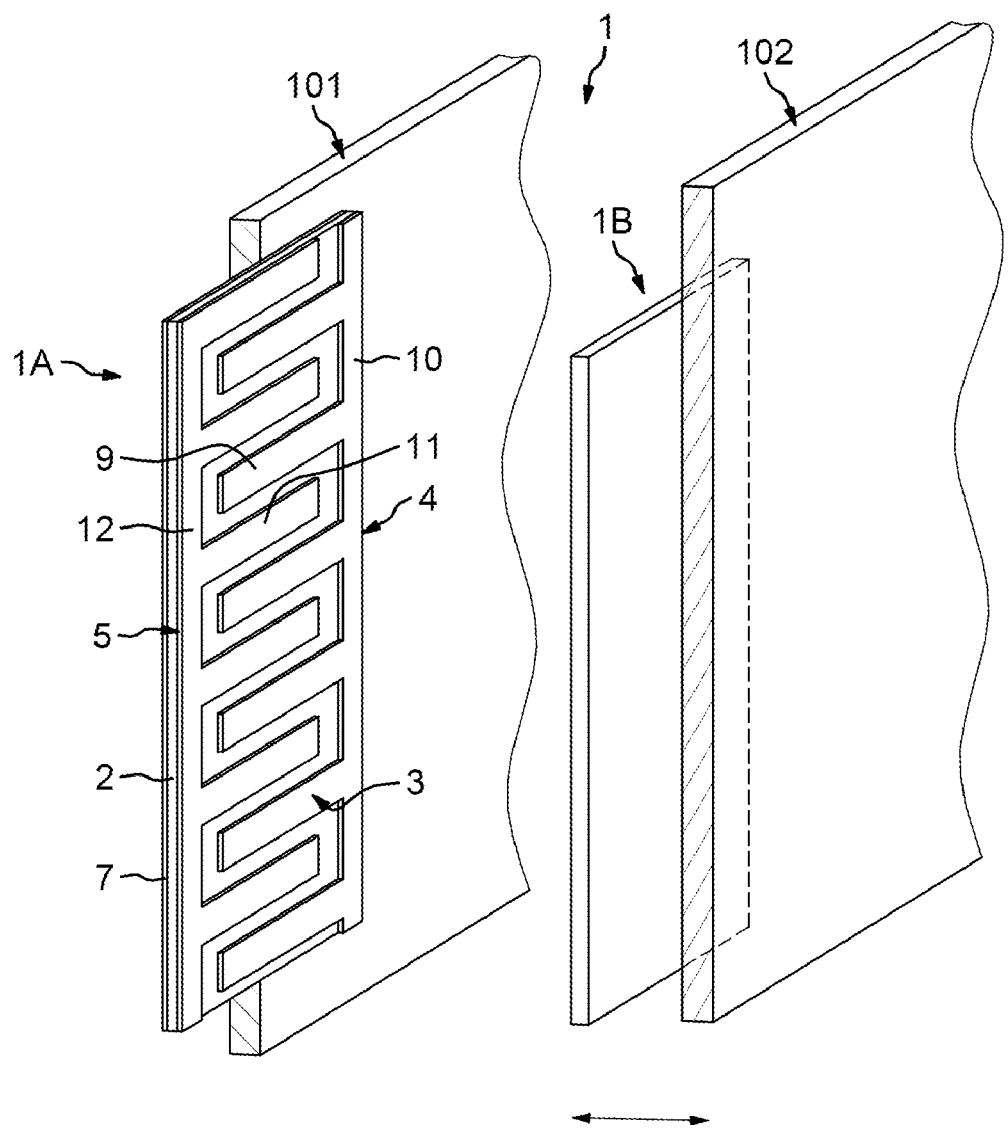

According to another application illustrated in FIG. 6, the capacitive detector 1A and the containment electrode 1B, arranged parallel and facing, are respectively secured to parts 101 and 102 that are mobile in the direction of convergence and/or of separation of the capacitive detector 1A and the containment electrode 1B, the dielectric medium between the capacitive detector 1A and the containment electrode 1B being deformable, for example a gas. Advantageously, the containment electrode 1B covers, at a distance, all the surface of the capacitive detector 1A.

In the abovementioned formula (2) the dielectric permittivity $\varepsilon_m$ of the chosen medium is that of the dielectric medium established between the capacitive detector 1A and the containment electrode 1B.

The measured value of the mutual capacitance between the first and second interdigital electrodes 4 and 5 is a function of the distance between the capacitive detector 1A and the containment electrode 1B. This function being programmed, the electronic measurement circuit 14 is capable of delivering at its output 18 the position and values of displacements of the parts 101 and 102 relative to one another. By calculation, the electronic measurement circuit 14 can also be capable of delivering the rate of displacements of the parts 101 and 102 relative to one another.

Figure 7:
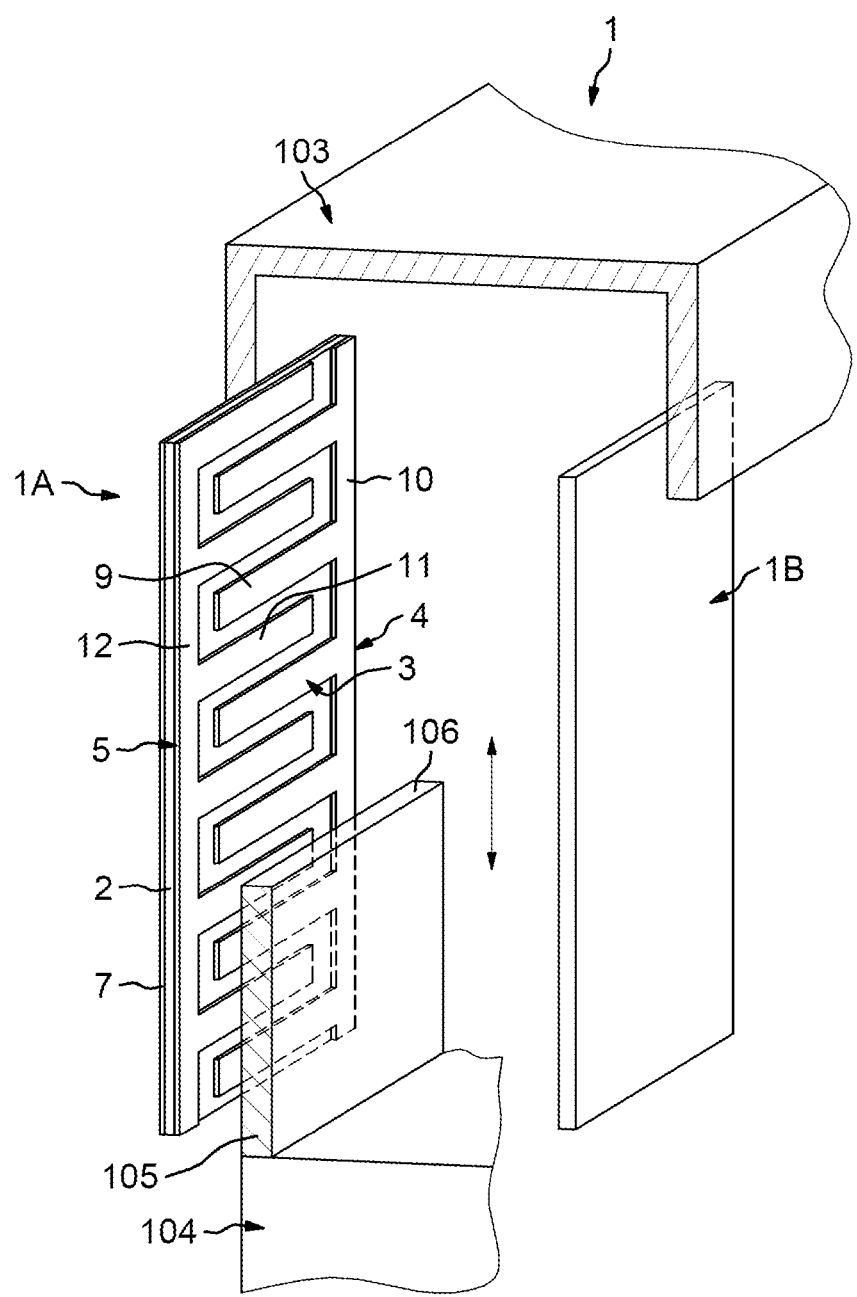

According to another application illustrated in FIG. 7, the capacitive detector 1A and the containment electrode 1B, arranged parallel and facing, are secured to a part 103. Advantageously, the containment electrode 1B covers, at a distance, all the surface of the capacitive detector 1A.

A part 104 is provided with a dielectric blade 105 which is partially engaged between the capacitive detector 1A and the containment electrode 1B and which is arranged parallel to and at a distance from the latter.

The parts are mobile relative to one another in the longitudinal direction of the capacitive detector 1A. The dielectric blade 105 has a transverse end edge 106 parallel to the branches 8 and 9 of the interdigital electrodes 4 and 5. Advantageously, the dielectric blade 105 covers, at a distance, all the surface of the capacitive detector 1A.

In this application, there is a situation substantially equivalent to the situation described with reference to FIG. 5, the dielectric blade 105 playing a role substantially equivalent to that of the blade L of liquid.

Thus, the measured value of the mutual capacitance between the first and second interdigital electrodes 4 and 5 is a function of the length of the portion of the pair 3 of interdigital electrodes 4 and 5 of the capacitive detector 1A, covered by the dielectric blade 105, and therefore, substantially on the number of horizontal branches 9 and 11 of the interdigital electrodes 4 and 5, covered by the dielectric blade 105.

This function being programmed, the electronic measurement circuit 14 is capable of delivering at its output 18 the longitudinal position of the dielectric blade 105 relative to the capacitive detector 1A and therefore the longitudinal position and values of displacements of the parts 103 and 104 relative to one another. Substantially, the variation of the measured value of the mutual capacitance between the first and second interdigital electrodes 4 and 5 is proportional to the length of the dielectric blade 105 engaged between the capacitive detector 1A and the containment electrode 1B. By calculation, the electronic measurement circuit 14 can also be capable of delivering the rate of the displacements of the parts 103 and 104 relative to one another.

Figure 8:
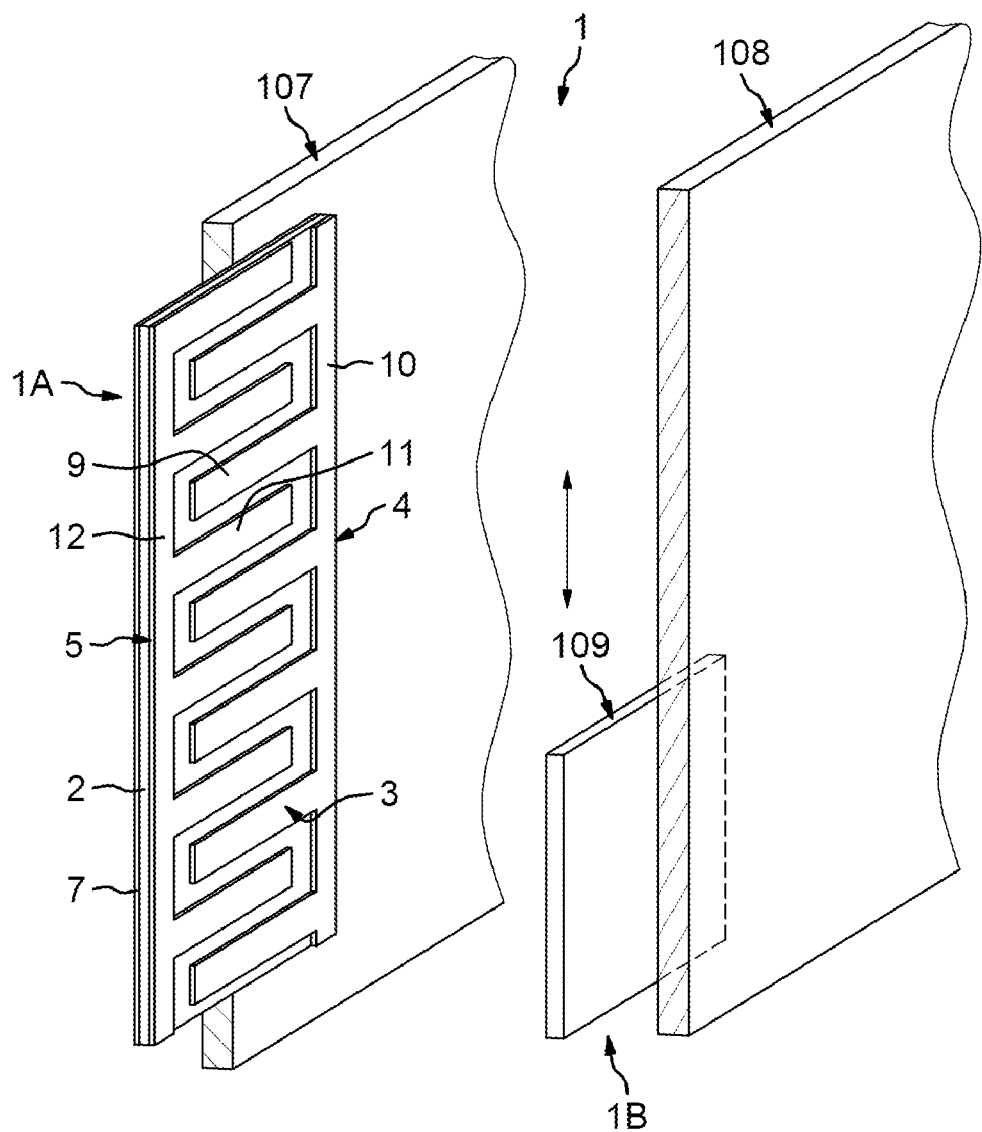

According to another application illustrated in FIG. 8, the capacitive detector 1A and the containment electrode 1B, arranged parallel and facing, are respectively secured to parts 107 and 108 that are longitudinally mobile relative to one another.

The containment electrode 1B has an end edge 109 parallel to the branches 9 and 11 of the interdigital electrodes 4 and 5 and is arranged so as to cover, at a distance, an end portion of the capacitive detector 1A.

The measured value of the mutual capacitance between the first and second interdigital electrodes 4 and 5 is a function of the length of the portion of the pair 3 of interdigital electrodes 4 and 5 of the capacitive detector 1A covered, at a distance, by the containment electrode 1B, and therefore of the longitudinal position of the parts 107 and 108 relative to one another.

This function being programmed, the electronic measurement circuit 14 is capable of delivering at its output 18 the longitudinal position of the containment electrode 1B relative to the capacitive detector 1A and therefore the longitudinal position and values of displacements of the parts 107 and 108 relative to one another. Substantially, the variation of the measured value of the mutual capacitance between the first and second interdigital electrodes 4 and 5 is proportional to the value of the overlap between the capacitive detector 1A and the containment electrode 1B. By calculation, the electronic measurement circuit 14 can also be capable of delivering the rate of the displacements of the parts 107 and 108 relative to one another.

Figure 9:
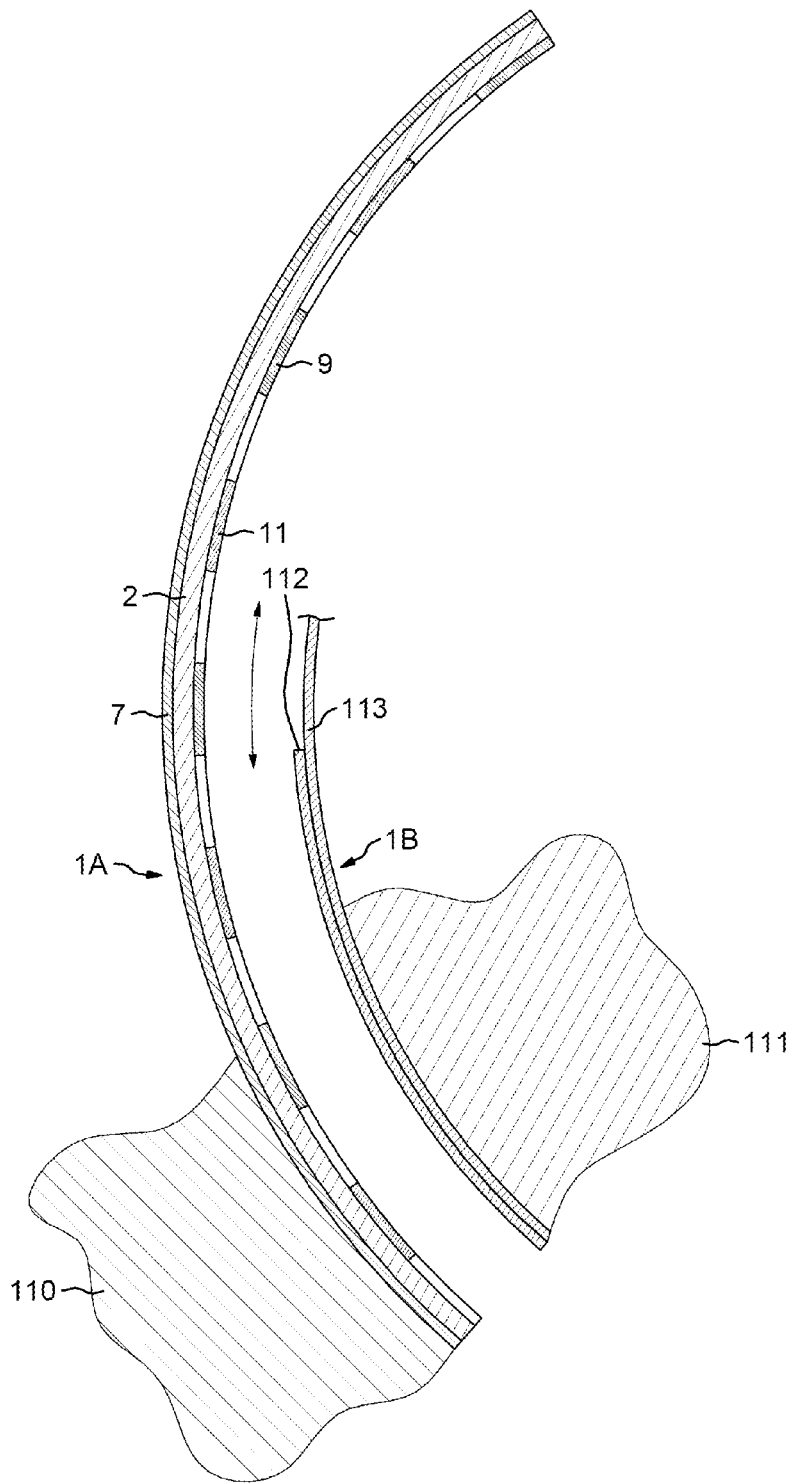

According to another application illustrated in FIG. 9, the parts 110 and 111 are rotationally mobile relative to one another according to an axis of rotation. In this case, the capacitive detector 1A and the containment electrode 1B are respectively secured to the parts 110 and 111 and are formed in an annular fashion according to circumferences co-axial to parts 110 and 111, the capacitive detector 1A and the containment electrode 1B radially facing one another.

The branches 9 and 11 of the interdigital electrodes extend axially. The containment electrode 1B has an axial end edge 112 parallel to the branches 9 and 11 of the interdigital electrodes 4 and 5 and is arranged so as to cover, at a distance, an end portion of the capacitive detector 1A.

In a variant embodiment, the capacitive detector 1A and the containment electrode 1B could be arranged axially facing one another, the branches 9 and 11 of the interdigital electrodes then extending radially and the edge 112 then extending radially.

The measured value of the mutual capacitance between the first and second interdigital electrodes 4 and 5 is a function of the length of the arc of the portion of the pair 3 of interdigital electrodes 4 and 5 of the capacitive detector 1A, covered, at a distance, by the arc of the containment electrode 1B, and therefore of the annular position of the parts 107 and 108 relative to one another.

This function being programmed, the electronic measurement circuit 14 is capable of delivering at its output 18 the angular position of the containment electrode 1B relative to the capacitive detector 1A and therefore the angular position and values of angular displacements of the parts 107 and 108 relative to one another. By calculation, the electronic measurement circuit 14 can also be capable of delivering the rate of rotation of the parts 107 and 108 relative to one another.

In the applications which have just been described, the containment electrode 1B can be fixed to the part which bears it via a sheet 113 of a dielectric material, for example of a plastic material such as a polyimide like Kapton, or such as a polytetrafluoroethylene (Teflon), in order to avoid having the material of the part which bears the containment electrode 1B prevent or influence the measurements performed. The containment electrode 1B can consist of a metal part of the part, subject to the condition, notably in the applications of FIGS. 8 and 9, of the existence of the edges 109 and 112 which determine an end of the surface of the containment electrode 1B, allowing the measurements facing the capacitive detector 1A, and provided that the surface of the part, which follows this edge, is further away from the capacitive detector 1A.

While illustrative embodiments have been illustrated and described, it will be appreciated that various changes can be made therein without departing from the spirit and scope of the invention.

The embodiments of the invention in which an exclusive property or privilege is claimed are defined as follows:

1. A capacitive detection device comprising:
    a capacitive detector comprising:
        a ribbon made of a dielectric material;
        at least one pair of electrodes comprising a first electrode in the form of a comb formed on a first face of said ribbon and comprising parallel transverse branches linked to one another by a longitudinal link branch and a second electrode in the form of a comb formed on said first face of said ribbon and comprising parallel transverse branches linked to one another by a longitudinal link branch, the parallel transverse branches of said first and second electrodes being arranged alternately between one another according to at least one determined period ($\lambda$); and
        at least one third electrode in the form of a layer formed on a second face of said ribbon, this at least one third electrode and said at least one pair of electrodes covering opposite areas of said ribbon;
        wherein a containment electrode is arranged at least partly facing and at a distance from said pair of electrodes, so as to leave, between the containment electrode and said pair of electrodes, a fluid-receiving space that is configured to receive a fluid, with the containment electrode being electrically connected to said third electrode.

2. The capacitive detection device of claim 1, in which the capacitive detector and the containment electrode are flat and arranged parallel.

3. The capacitive detection device of claim 1, in which the capacitive detector and the containment electrode extend along concentric circumferences.

4. The capacitive detection device of claim 1, in which a thickness (e) of the ribbon is less than or equal to said at least one determined period ($\lambda$) divided by four times PI, i.e.: $\lambda/4\pi \geq e$; and in which a ratio, resulting from the division, in numerator, of a capacitance (C) between two adjacent branches of said first and second electrodes in the presence of at least one chosen medium of dielectric permittivity ($\varepsilon_m$), interposed between the capacitive detector and the containment electrode, and in denominator by a dielectric permittivity ($\varepsilon_m$) of the at least one chosen medium multiplied by a capacitance (Co) between the two adjacent branches of the first and second electrodes in the presence of vacuum, is greater than or equal to one.

5. The capacitive detection device of claim 1, in which the distance between the containment electrode and the capacitive detector lies between a twentieth of and twenty times said at least one determined period ($\lambda$).

6. The capacitive detection device of claim 1, comprising an electronic measurement circuit to which said first and second electrodes are linked, the third electrode and the containment electrode being set at a same reference potential, the electronic measurement circuit comprising a measurement device linked to the first and second electrodes and capable of delivering an electrical signal relating to a measurement of a capacitance between the first and second electrodes.

7. A device for measuring a fluid level or a fluid film thickness, comprising:
   the capacitive detection device of claim 1, in which at least a part of the fluid is present between the capacitive detector and the containment electrode;
   and a means for measuring a capacitance between said first and second electrodes of the pair of electrodes of the capacitive detector.

8. A device for measuring displacement of a first part relative to a second part, comprising:
   the capacitive detection device of claim 1, in which the capacitive detector is secured to one of the first and second parts and the containment electrode is secured to the other of the first and second parts;
   and a means for measuring a capacitance between said first and second electrodes of the pair of electrodes of the capacitive detector.

9. The device of claim 8, in which said first and second parts are capable of being displaced in a direction which moves the capacitive detector and the containment electrode away from and/or closer to one another.

10. The device of claim 8, in which said first and second parts are capable of being displaced in a direction which increases or reduces an overlap of the containment electrode relative to the capacitive detector.

11. A device for measuring displacement of a first part relative to a second part, comprising:
   the capacitive detection device of claim 1, in which the capacitive detector and the containment electrode are secured to one of the first and second parts, the other of the first and second parts comprising a dielectric element secured to the other of the first and second parts and engaged between the capacitive detector and the containment electrode; and
   a means for measuring a capacitance between said first and second electrodes of the pair of electrodes of the capacitive detector.

* * * * *